United States Patent
Chen

(10) Patent No.: US 10,862,447 B2
(45) Date of Patent: Dec. 8, 2020

(54) METHOD FOR PROCESSING A LITHIUM TANTALATE CRYSTAL SUBSTRATE

(71) Applicant: Fujian Jing'An Optoelectronics Co., Ltd., Quanzhou (CN)

(72) Inventor: Mingxin Chen, Quanzhou (CN)

(73) Assignee: Fujian Jing'An Optoelectronics Co., Ltd., Quanzhou (CN)

( * ) Notice: Subject to any disclaimer, the term of this patent is extended or adjusted under 35 U.S.C. 154(b) by 0 days.

(21) Appl. No.: 16/452,037

(22) Filed: Jun. 25, 2019

(65) Prior Publication Data
US 2019/0326871 A1 Oct. 24, 2019

Related U.S. Application Data

(63) Continuation-in-part of application No. PCT/CN2017/097847, filed on Aug. 17, 2017.

(30) Foreign Application Priority Data

Dec. 26, 2016 (CN) .......................... 2016 1 1213934

(51) Int. Cl.
*H03H 3/08* (2006.01)
*H03H 9/02* (2006.01)
*H03H 9/64* (2006.01)

(52) U.S. Cl.
CPC .......... *H03H 3/08* (2013.01); *H03H 9/02559* (2013.01); *H03H 9/02622* (2013.01); *H03H 9/64* (2013.01)

(58) Field of Classification Search
CPC ........ H03H 3/08; H03H 9/64; H03H 9/02622; H03H 9/02559; H01L 41/1873; H01L 41/08; C30B 33/00; C30B 29/30
See application file for complete search history.

(56) References Cited

U.S. PATENT DOCUMENTS

2005/0145165 A1  7/2005 Kajigaya et al.
2006/0169196 A1* 8/2006 Shiono .................... C30B 29/30
                                                              117/2

(Continued)

FOREIGN PATENT DOCUMENTS

CN     1621578 A    6/2005
CN     1754014 A    3/2006

(Continued)

OTHER PUBLICATIONS

World Intellectual Property Organization, "Search Report" and English-translation thereof issued in international application No. PCT/CN2017/097847 by the CNIPA dated Oct. 24, 2017, document of 4 pages.

*Primary Examiner* — Duy Vu N Deo
(74) *Attorney, Agent, or Firm* — Akerman LLP; Peter A. Chiabotti

(57) ABSTRACT

A method for processing a lithium tantalate crystal substrate includes providing a lithium tantalate crystal substrate and a metallic sheet, roughening at least one of the lithium tantalate crystal substrate and the metallic sheet, bringing the lithium tantalate crystal substrate and the metallic sheet into contact with each other after the at least one thereof is roughened, and subjecting the lithium tantalate crystal substrate to a reduction treatment. The reduction treatment is conducted at a temperature not higher than a Curie temperature of the lithium tantalate crystal substrate.

16 Claims, 3 Drawing Sheets

(56) References Cited

U.S. PATENT DOCUMENTS

2007/0122337 A1     5/2007   Kajigaya et al.
2008/0317663 A1*   12/2008   Kajigaya ................. C30B 15/00
                                                                            423/594.8

FOREIGN PATENT DOCUMENTS

| CN | 1856597 A | 11/2006 |
| CN | 105463581 A | 4/2016 |
| CN | 106283196 A | 1/2017 |
| CN | 106521633 A | 3/2017 |
| WO | 2004030047 A1 | 4/2004 |

\* cited by examiner

METHOD FOR PROCESSING A LITHIUM TANTALATE CRYSTAL SUBSTRATE

CROSS-REFERENCE TO RELATED APPLICATION

This application is a bypass continuation-in-part application of International Application No. PCT/CN2017/097847 filed on Aug. 17, 2017, which claims priority of Chinese Patent Application No. 201611213934.9, filed on Dec. 26, 2016. The entire content of each of the international and Chinese patent applications is incorporated herein by reference.

FIELD

The disclosure relates to a method for processing a lithium tantalate crystal substrate, and more particularly to a method for processing a lithium tantalate crystal substrate with a metallic sheet.

BACKGROUND

Lithium tantalate ($LiTaO_3$) (abbreviated as LT) crystal is ferroelectric crystal having a melting point of about 1650° C. and a Curie temperature of about 600° C. to 610° C. LT crystal substrates serve as materials of surface acoustic wave (SAW) filters for processing high-frequency signals of mobile phones. However, LT crystal substrates might lead to the following two problems during production of SAW filters, thereby reducing the production yield and increasing the production cost. First, since LT crystal substrates have high light transmittance, light might undesirably reflect on such substrates back to a surface thereof to be patterned during the photolithography process applied for production of SAW filters, such that the resolution of the pattern thus formed is reduced. Secondly, LT crystal, which has a high pyroelectric coefficient, might easily generate a large amount of electrostatic charges on the surface of chips due to temperature change, such that these electrostatic charges might be spontaneously released between metallic interdigital electrodes or chips and hence lead to cracking of the chips and burning of the metallic interdigital electrodes.

In order to resolve the aforesaid problems, LT crystal substrates may be subjected to a reduction treatment to reduce the volume resistivity thereof. During such reduction treatment, the LT crystal substrates change from colorless or transparently pale yellow to opaquely colored. The opaquely colored LT crystal substrates have lowered light transmittance, such that the surface thereof to be patterned may have an improved pattern resolution, and such that the electric conductivity can be enhanced to reduce the pyroelectricity for preventing cracking of chips and burning of metallic interdigital electrodes which result from generation of an electrostatic field. Since the LT crystal substrates subjected to a reduction treatment normally have a grey or black surface, such treatment is referred to as blackening.

For instance, CN 1754014 A discloses a method for processing a LT crystal substrate, which comprises bringing a first LT crystal substrate to be processed into contact with a second LT crystal substrate already reduced, and subjecting the first LT crystal substrate to a reduction treatment. However, the second LT crystal substrate must be subjected to reduction at a high temperature that is the Curie temperature of LT or higher before contacting the first LT crystal substrate to be processed (i.e. a total of two reduction treatments are required for the method of CN 1754014 A). Moreover, the first LT crystal substrate to be processed might be required to be subjected to a lapping process before being brought into contact with the second LT crystal substrate already reduced. Therefore, the method of CN 1754014 A is complicated, time-consuming, and cost-ineffective.

In addition, CN 1856597 A discloses a method for processing a LT crystal substrate, which comprises burying a LT crystal substrate in a strong reducing agent composed of a pure element (e.g. Al) or a reducing agent in the form of mixed powder composed of a pure element and a compound (e.g. Al and $Al_2O_3$), and subjecting the LT crystal substrate to a heat treatment in the presence of a flowing gas (such as $N_2$, $H_2$, Co, etc.). Since it is complicated to optimize the compositional ratio and uniformity of the mixed powder, the method of CN 1856597 A is time-consuming and cost-ineffective.

SUMMARY

Therefore, an object of the disclosure is to provide a method for processing a lithium tantalate crystal substrate that can alleviate at least one of the drawbacks of the prior art.

The method includes providing a lithium tantalate crystal substrate and a metallic sheet, roughening at least one of the lithium tantalate crystal substrate and the metallic sheet, bringing the lithium tantalate crystal substrate and the metallic sheet into contact with each other after the at least one thereof is roughened, and subjecting the lithium tantalate crystal substrate to a reduction treatment. The reduction treatment is conducted at a temperature not higher than a Curie temperature of the lithium tantalate crystal substrate.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
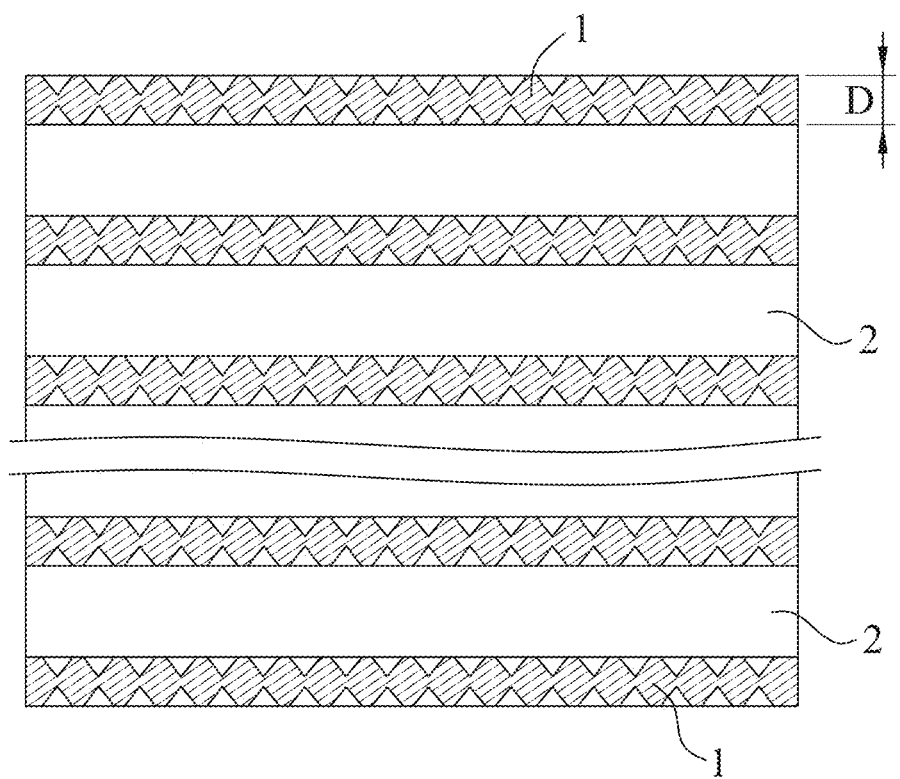
FIG. 1 is a schematic sectional view illustrating a first embodiment of a method for processing a lithium tantalate crystal substrate according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

The present disclosure provides a method for processing a lithium tantalate ($LiTaO_3$) (abbreviated as LT) crystal substrate, which includes providing a LT crystal substrate and a metallic sheet, roughening at least one of the LT crystal substrate and the metallic sheet, bringing the LT crystal substrate and the metallic sheet into contact with each other after the at least one thereof is roughened, and subjecting the LT crystal substrate to a reduction treatment. The reduction treatment is conducted at a temperature not higher than a Curie temperature of the LT crystal substrate.

In general, the term "reduction" refers to gaining electrons, and is the opposite of the term "oxidation" which refers to removing electrons. For example, removing oxygen from a material may reduce one or more components of the material. Reduction changes the optical properties of LT crystal. Without reduction, LT crystal is transparent in visible light. With increasing degree of reduction, LT crystal becomes more and more opaque and darker. That is, optical transmission decreases in the reduced LT crystal.

When the LT crystal substrate is subjected to the reduction treatment, oxidation occurs simultaneously on a reducing agent such as the metallic sheet, a gaseous reducing agent, and so forth.

The metallic sheet may have a thickness ranging from 0.05 mm to 20 mm, and may contain a metal component selected from the group consisting of aluminum (Al), titanium (Ti), zinc (Zn), iron (Fe), and combinations thereof.

The at least one of the LT crystal substrate and the metallic sheet (i.e. the LT crystal substrate alone, the metallic sheet alone, or both of the LT crystal substrate and the metallic sheet) may be roughened at a surface thereof, and may be roughened through a chemical etching treatment (for instance, a wet etching treatment). The wet etching treatment may be conducted using a solution selected from the group consisting of hydrofluoric acid, nitric acid, and a combination thereof, and may be conducted at a temperature ranging from 20° C. to 80° C. For roughening the LT crystal substrate, the wet etching treatment may be conducted for 3 to 10 hours. For roughening the metallic sheet, the wet etching treatment may be conducted for 3 to 10 minutes.

The at least one of the LT crystal substrate and the metallic sheet, when roughened at a surface thereof, may have a surface roughness (Ra) ranging from 0.1 μm to 10 μm. In some embodiments, the at least one of the LT crystal substrate and the metallic sheet is roughened to have a surface roughness that is larger than 3 μm and not greater than 10 μm.

The reduction treatment may be conducted in the presence of a gas selected from the group consisting of a hydrogen gas, a carbon monoxide gas, a nitrous oxide gas, a nitrogen gas, an argon gas, and combinations thereof. The gas may be allowed to flow during the reduction treatment, and may have a flow rate ranging from 0.3 to 5.0 liters per minute.

The temperature for conducting the reduction treatment may range from 350° C. to 610° C. The reduction treatment may be conducted for 3 to 12 hours. The reduction treatment may be conducted in a furnace, and may be conducted at a pressure ranging from 3.0 kPa to 20 kPa.

First, second, and third embodiments of the method according to the present disclosure are illustrated below.

Referring to FIG. 1, in the first embodiment of the method, a plurality of the metallic sheets 1 and a plurality of the LT crystal substrates 2 are provided. The metallic sheets 1 may have the thickness (D) described above, and may contain Al this embodiment. Each of the metallic sheets 1 is roughened at two opposite surfaces thereof through the wet etching treatment described above, thereby having the Ra described above. In a quartz chamber, the roughened metallic sheets 1 and the LT crystal substrates 2 are brought into contact with one another, to be specific, are alternately stacked on one another. The roughened metallic sheets 1 and the LT crystal substrates 2 are subjected to the reduction treatment described above in a furnace. The temperature for conducting the reduction treatment ranges from 350° C. to 600° C. in this embodiment.

Figure 2:
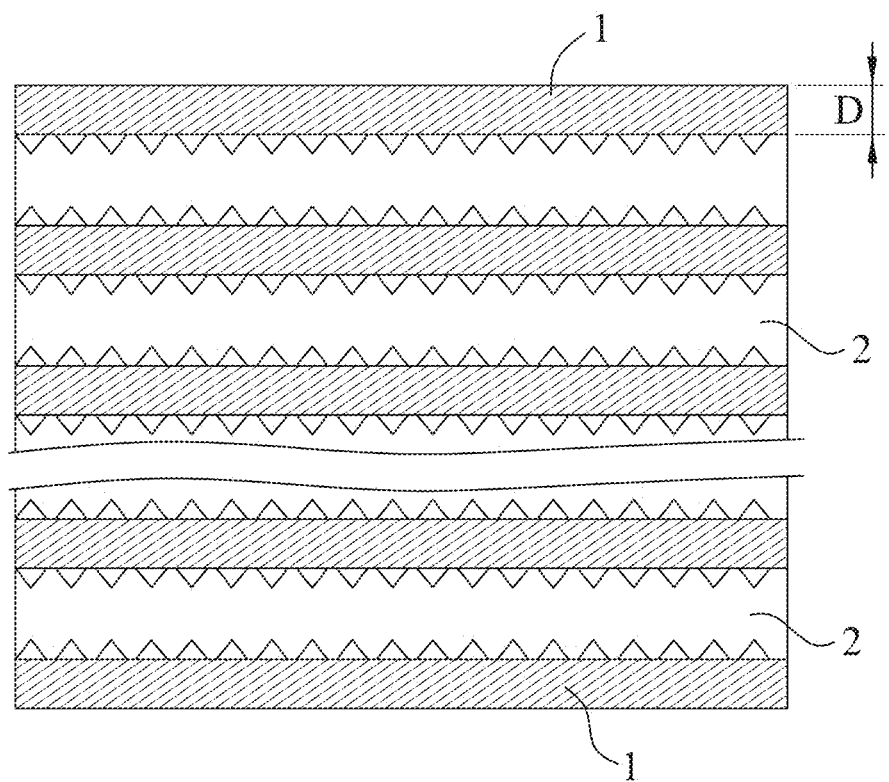
FIG. 2 is a schematic sectional view illustrating a second embodiment of the method according to the present disclosure.

Referring to FIG. 2, the second embodiment of the method is similar to the first embodiment of the method, except that each of the LT crystal substrates 2, rather than each of the metallic sheets 1, is roughened at two opposite surfaces thereof through the wet etching treatment described above and hence has the Ra described above.

Figure 3:
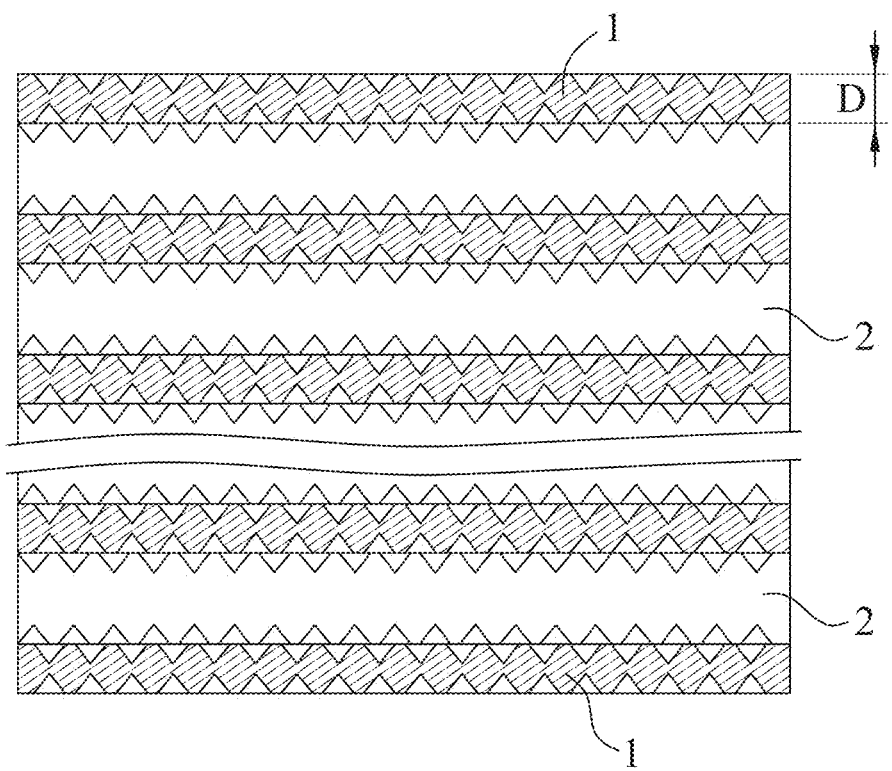
FIG. 3 is a schematic sectional view illustrating a third embodiment of the method according to the present disclosure.

Referring to FIG. 3, the third embodiment of the method is similar to the first embodiment of the method, except that each of the metallic sheets 1 and the LT crystal substrates 2 is roughened at two opposite surfaces thereof through the wet etching treatment described above and hence has the Ra described above.

The advantages or the method of the present disclosure are described below.

In case that a LT crystal substrate and a metallic sheet are brought into contact with each other (e.g. by stacking) but both are not roughened, such LT crystal substrate and such metallic sheet not roughened have an unsatisfactorily low Ra (i.e. a high surface flatness) and hence have no space therebetween upon contact. Therefore, a flowing gas intended to reduce the LT crystal substrate can hardly get access to the surface of the LT crystal substrate, thus decreasing the reduction rate of the LT crystal substrate. In contrast to the case mentioned above, in the method of the present disclosure (taking the first and third embodiments above as examples), a roughened metallic sheet and a LT crystal substrate may be stacked on each other, so that a flowing gas for reducing the LT crystal substrate can get access to the surface of the LT crystal substrate and hence enhance the reduction rate.

In addition, since an unroughened metallic sheet as described above might form an oxidation layer on a surface thereof to be brought into contact, such oxidation layer might prohibit a LT crystal substrate from being reduced. Nevertheless, the method of the present disclosure (taking the first and third embodiments above as examples), which may include a step of roughening a metallic sheet to remove an oxidation layer thereof and to achieve a satisfactory Ra, can allow a LT crystal substrate to be reduced by virtue of the metallic sheet and/or a flowing gas.

Normally, a LT crystal substrate to be reduced might have been subjected to polishing, thereby having a more unsatisfactorily low Ra (i.e. a higher surface flatness). Thus, there might be no space between such LT crystal substrate and a metallic sheet in contact therewith (e.g. stacked thereon). In order for a flowing gas serving as a reducing agent to get access to the surface of the LT crystal substrate and to hence enhance the reduction rate, in the method of the present disclosure (taking the second and third embodiments above as examples), a LT crystal substrate may be roughened first to increase the Ra thereof and then stacked onto metallic sheet. Alternatively, a metallic sheet might have been subjected to polishing, thereby having a more unsatisfactorily low Ra. Likewise, the metallic sheet may be roughened first to increase the Ra thereof and then stacked onto a LT crystal substrate (taking the first and third embodiments above as examples) Or even alternatively, both a LT crystal substrate to be reduced and a metallic sheet might have been subjected to polishing, thereby having a more unsatisfactorily low Ra, Likewise, both the LT crystal substrate and the metallic sheet may be roughened first to increase the Ra thereof and then stacked onto each other (taking the third embodiment above as an example).

Besides, since a LT crystal substrate which has been subjected to polishing as described above might have a damaged layer on a surface thereof to be brought into contact, such damaged layer might prohibit the LT crystal substrate from being reduced. Nevertheless, the method of the present disclosure (taking the second and third embodiments above as examples), which may include a step of roughening a polished LT crystal substrate to remove a damaged layer thereof and to achieve a satisfactory Ra, can allow the LT crystal substrate to be reduced by virtue of a metallic sheet and/or a flowing gas. Likewise, a metallic sheet which has been subjected to polishing as described above might have a damaged layer on a surface thereof to be brought into contact, and such damaged layer hence might prohibit the LT crystal substrate from being reduced. The method of the present disclosure (taking the first and third embodiments above as examples), which may include a step of roughening a polished metallic sheet to remove a damaged layer thereof and to achieve a satisfactory Ra, can allow the LT crystal substrate to be effectively reduced.

By virtue of the method of the present disclosure, a 4-inch LT crystal substrate for surface acoustic wave filters, which has volume resistivity of $1\times10^{10}$ to $1\times10^{12}$ $\Omega$cm, may be obtained. Furthermore, a LT crystal substrate obtained through the method of the present disclosure may have satisfactory resistivity and light transmittance, and may still possess characteristics of piezoelectric LT materials.

Lastly, the metallic sheet employed in the method of the present disclosure for processing the LT crystal substrate is cost-effective, rendering the method of the present disclosure satisfactory in terms of the cost.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for processing a lithium tantalate crystal substrate, comprising:
   providing a lithium tantalate crystal substrate and a metallic sheet;
   roughening at least one of the lithium tantalate crystal substrate and the metallic sheet;
   bringing the lithium tantalate crystal substrate and the metallic sheet into contact with each other after the at least one thereof is roughened; and
   subjecting the lithium tantalate crystal substrate to a reduction treatment,
   wherein the reduction treatment is conducted at a temperature not higher than a Curie temperature of the lithium tantalate crystal substrate, and
   wherein the at least one of the lithium tantalate crystal substrate and the metallic sheet is roughened via a chemical etching treatment.

2. The method as claimed in claim 1, wherein the metallic sheet has a thickness ranging from 0.05 mm to 20 mm.

3. The method as claimed in claim 1, wherein the metallic sheet comprises a metal component selected from the group consisting of aluminum, titanium, zinc, iron, and combinations thereof.

4. The method as claimed in claim 1, wherein the chemical etching treatment is a wet etching treatment.

5. The method as claimed in claim 1, wherein the at least one of the lithium tantalate crystal substrate and the metallic sheet is roughened to have a surface roughness that is larger than 3 µm and not greater than 10 µm.

6. The method as claimed in claim 1, wherein the reduction treatment is conducted in the presence of a gas selected from the group consisting of a hydrogen gas, a carbon monoxide gas, a nitrous oxide gas, a nitrogen gas, an argon gas, and combinations thereof.

7. The method as claimed in claim 6, wherein the gas has a flow rate ranging from 0.3 to 5.0 liters per minute.

8. The method as claimed in claim 1, wherein the temperature for conducting the reduction treatment ranges from 350° C. to 610° C.

9. The method as claimed in claim 8, wherein the reduction treatment is conducted for 3 to 12 hours.

10. The method as claimed in claim 1, wherein the reduction treatment is conducted at a pressure ranging from 3.0 kPa to 20 kPa.

11. The method as claimed in claim 1, wherein the lithium tantalate crystal substrate is roughened.

12. The method as claimed in claim 1, wherein the metallic sheet is roughened.

13. The method as claimed in claim 1, wherein the lithium tantalate crystal substrate and the metallic sheet are roughened.

14. A method for processing a lithium tantalate crystal substrate, comprising:
   providing a lithium tantalate crystal substrate and a metallic sheet;
   roughening at least one of the lithium tantalate crystal substrate and the metallic sheet;
   bringing the lithium tantalate crystal substrate and the metallic sheet into contact with each other after the at least one thereof is roughened; and
   subjecting the lithium tantalate crystal substrate to a reduction treatment,
   wherein the reduction treatment is conducted at a temperature not higher than a Curie temperature of the lithium tantalate crystal substrate, and
   wherein the at least one of the lithium tantalate crystal substrate and the metallic sheet is roughened to have a surface roughness that is larger than 3 µm and not greater than 10 µm.

15. The method as claimed in claim 14, wherein the reduction treatment is conducted at a pressure ranging from 3.0 kPa to 20 kPa.

16. A method for processing a lithium tantalate crystal substrate, comprising:
   providing a lithium tantalate crystal substrate and a metallic sheet;
   roughening at least one of the lithium tantalate crystal substrate and the metallic sheet;

bringing the lithium tantalate crystal substrate and the metallic sheet into contact with each other after the at least one thereof is roughened; and subjecting the lithium tantalate crystal substrate to a reduction treatment, wherein the reduction treatment is conducted at a temperature not higher than a Curie temperature of the lithium tantalate crystal substrate, and wherein the reduction treatment is conducted at a pressure ranging from 3.0 kPa to 20 kPa.

* * * * *